United States Patent
Sanada et al.

[11] Patent Number: 5,989,632
[45] Date of Patent: Nov. 23, 1999

[54] COATING SOLUTION APPLYING METHOD AND APPARATUS

[75] Inventors: Masakazu Sanada; Masahiro Mimasaka, both of Kyoto, Japan

[73] Assignee: Dainippon Screen Mfg. Co., Ltd., Japan

[21] Appl. No.: 08/953,928

[22] Filed: Oct. 20, 1997

[30] Foreign Application Priority Data

Oct. 21, 1996 [JP] Japan .................................. 8-278048

[51] Int. Cl.$^6$ ........................................................ B05D 3/12
[52] U.S. Cl. ..................... 427/240; 427/385.5; 437/231
[58] Field of Search .............................. 427/240, 385.5; 437/231; 118/52

[56] References Cited

U.S. PATENT DOCUMENTS

| | | | |
|---|---|---|---|
| 5,405,813 | 4/1995 | Rodrigues | 427/240 |
| 5,773,082 | 6/1998 | Ku et al. | 427/240 |
| 5,780,105 | 7/1998 | Wang | 427/240 |

*Primary Examiner*—Janyce Bell
*Attorney, Agent, or Firm*—Ostrolenk, Faber, Gerb & Soffen, LLP

[57] ABSTRACT

A method of applying a coating solution to a surface of a substrate to form a film of desired thickness thereon. The substrate is spun at low speed with a predetermined supplying rotational frequency, and the coating solution is supplied to a region centrally of the substrate. The substrate is decelerated to a predetermined standby rotational frequency lower than the supplying rotational frequency before the coating solution spreads over an entire surface of the substrate. Then, the substrate is accelerated to a target rotational frequency higher than the supplying rotational frequency before the coating solution spreads over the entire surface of the substrate. Subsequently, the substrate is spun at high speed with a predetermined film-forming rotational frequency, thereby coating the surface of the substrate with a film of desired thickness. The supply of the coating solution is continued at least during the deceleration to the standby rotational frequency.

18 Claims, 9 Drawing Sheets

Fig.17

# COATING SOLUTION APPLYING METHOD AND APPARATUS

BACKGROUND OF THE INVENTION

(1) Field of the Invention

This invention relates to methods and apparatus for applying a coating solution such as photoresist, SOG (Spin On Glass, also called a silica coating material) or polyimide resin to substrates such as semiconductor wafers, glass substrates for photomasks, glass substrates for liquid crystal displays or glass substrates for optical disks (hereinafter referred to simply as substrates) to form a film of the coating solution on the surface of each substrate. More particularly, the invention relates to a technique of supplying a coating solution to a substrate spun at a predetermined low rotational frequency, and thereafter spinning the substrate at a predetermined high rotational frequency to form a film of the coating solution in a desired thickness.

(2) Description of the Related Art

Figure 1:
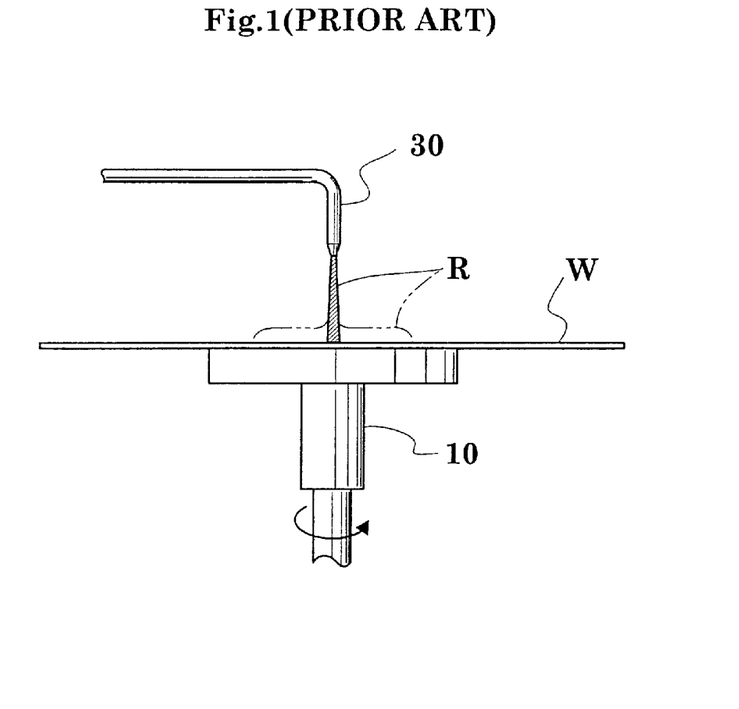
FIG. 1 is a view showing a principal portion of a conventional substrate spin coating apparatus.

A conventional coating solution applying method of the type noted above will be described, based on the apparatus shown in FIG. 1.

This figure shows a principal portion of a substrate spin coating apparatus. The apparatus includes a suction type spin chuck 10 for suction-supporting and spinning a substrate or wafer W in a substantially horizontal posture, and a coating solution supply nozzle 30 disposed substantially over the center of spin for supplying a photoresist solution R, which is a coating solution, to a surface of wafer W.

Figure 2:
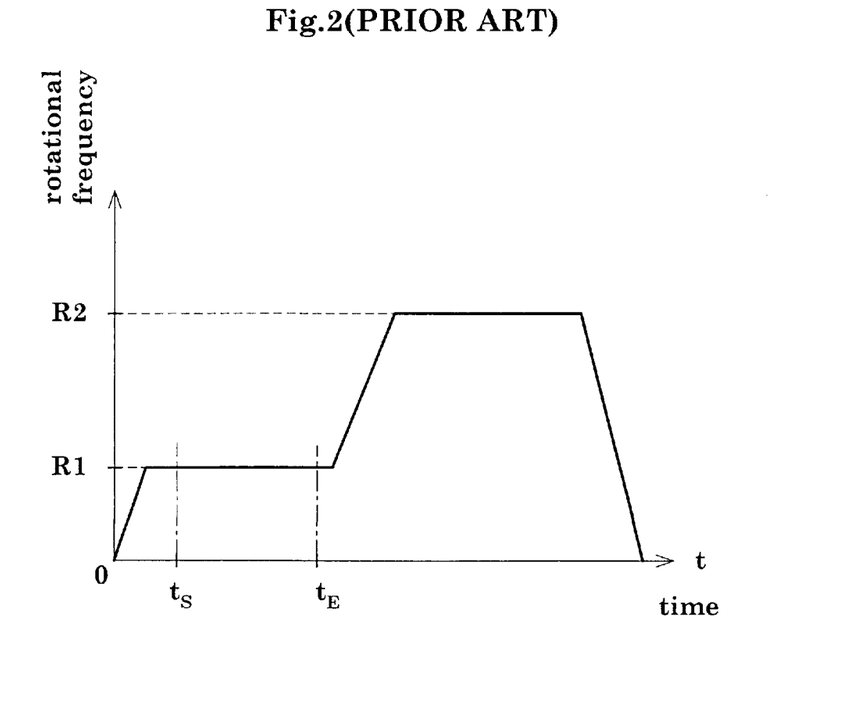
FIG. 2 is a time chart showing a conventional coating solution applying method.

The apparatus with this construction controls rotational frequency as shown in the time chart of FIG. 2, to form a photoresist film in a desired thickness on the surface of wafer W.

First, the spin chuck 10 is driven by a motor, not shown, to spin the wafer W at a predetermined low rotational frequency R1 (e.g. 900 rpm). At a point of time at which the spin stabilizes, photoresist solution R begins to be delivered at a substantially constant flow rate from the supply nozzle 30 (referenced $t_S$ in FIG. 2). Photoresist solution R continues to be supplied to a region around the spin center of wafer W. The supply of photoresist solution R is stopped at a point of time ($t_E$ in FIG. 2) which is a predetermined time after the photoresist supply starting point $t_S$. Then, the rotational frequency of the spin chuck 10 is increased from rotational frequency R1 to rotational frequency R2 (e.g. 3,000 rpm). This higher rotational frequency R2 is maintained for a predetermined time. Consequently, a superfluous part of photoresist solution R supplied to the surface of wafer W is dispelled, thereby forming a photoresist film in a desired thickness on the surface of wafer W.

In the conventional method described above, a photoresist film is formed as a result of a behavior of photoresist solution R as schematically shown in FIGS. 3A through 3F. In these figures, wafer W is shown in circles and photoresist solution R in hatched regions, for simplicity of illustration. The varied rotational frequencies of wafer W are schematically indicated by different sizes of arrows in the figures.

Figure 3A:
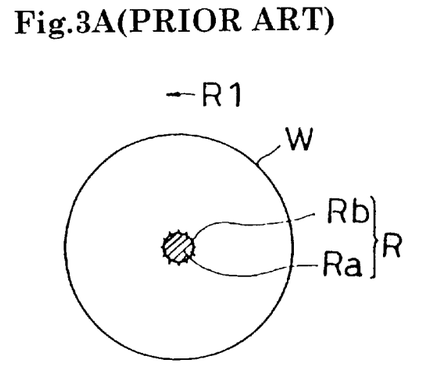
FIGS. 3A through 3F are explanatory views illustrating the conventional coating solution applying method.

Immediately after commencement of photoresist supply to the surface of wafer W spinning at the slow, supplying rotational frequency R1, as shown in FIG. 3A, photoresist solution R is present around the spin center of wafer W in the form of a drop Ra circular in plan view (which is hereinafter referred to as core Ra). As photoresist solution R continues to be supplied, the centrifugal force generated by the spin spreads the core Ra concentrically toward the edge of wafer W while allowing the core Ra substantially to retain the circular shape.

Figure 3B:
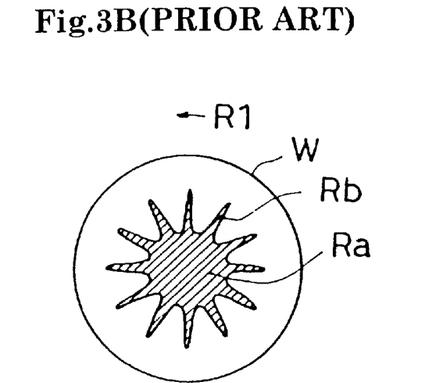

The core Ra retains the circular shape for a while (e.g. for several seconds), and thereafter undergoes conspicuous changes in shape. Specifically, as seen in FIG. 3A, photoresist solution R begins to flow in a plurality of rivulets (hereinafter referred to as fingers Rb) extending radially from the edge of circular core Ra toward the edge of wafer W. These numerous fingers Rb, by the centrifugal force, continue to grow toward the edge of wafer W with an increase in the diameter of core Ra as shown in FIG. 3B. The fingers Rb have a larger turning radius, and are therefore subjected to a greater centrifugal force, than the core Ra. Consequently, the fingers Rb grow toward the edge of wafer W faster than the enlargement of core Ra.

Figure 3C:
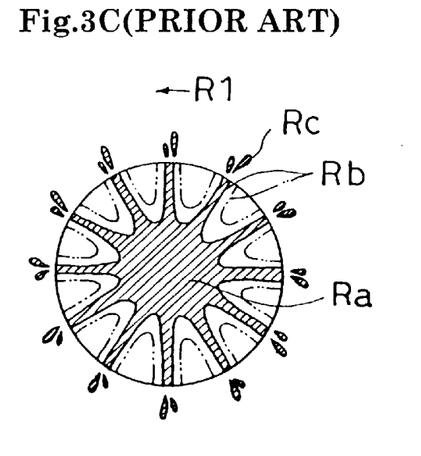
Figure 3D:
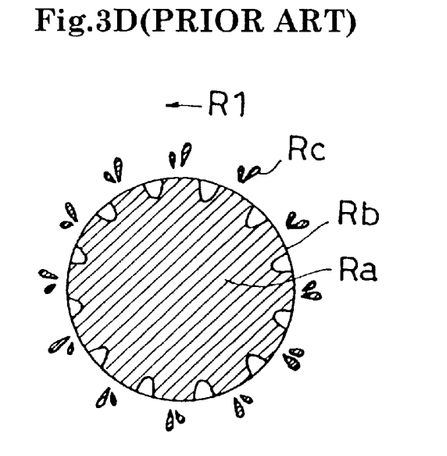
Figure 3E:
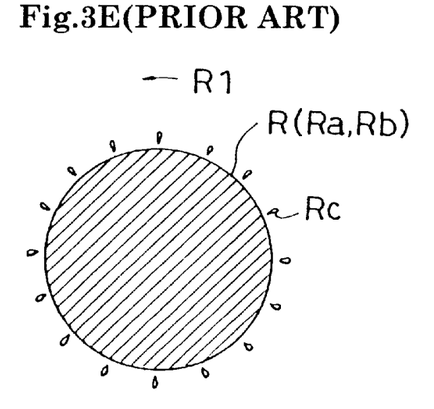

As photoresist solution R continues to be supplied to the wafer W spinning at the same supplying rotational frequency R1, leading ends of fingers Rb reach the edge of wafer W as shown in FIG. 3C. With the fingers Rb having reached the edge of wafer W, the photoresist solution R flows from the core Ra through the fingers Rb to the edge of wafer W to be scattered away (in scattering photoresist solution Rc). As the diameter of the core Ra increases further, the fingers Rb become broader as shown in two-dot-and-dash lines in FIG. 3C and FIG. 3D. As a result, regions between the fingers Rb not covered by photoresist solution R gradually diminish, until finally the entire surface of wafer W is covered by photoresist solution R (core Ra and fingers Rb) (FIG. 3E). Timing is determined beforehand for stopping the delivery of photoresist solution R through the supply nozzle 30 at this point of time (reference $t_E$ in FIG. 2).

Figure 3F:
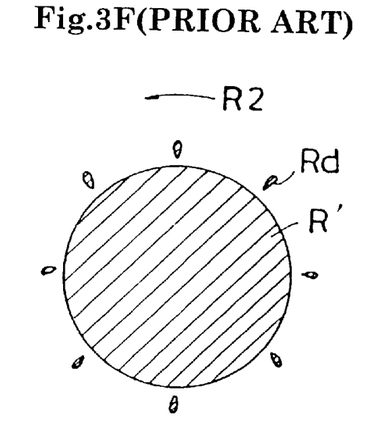

After the entire surface of wafer W is covered with photoresist solution R as above, the rotational frequency of wafer W is increased from the supplying rotational frequency R1 to the faster, film-forming rotational frequency R2. A superfluous part of photoresist solution R covering the surface of wafer W is dispelled (as excess photoresist solution Rd), thereby forming a photoresist film R' in a desired thickness on the surface of wafer W (FIG. 3F).

The conventional method described above has the following drawback.

When the numerous fingers Rb reach the edge of wafer W, as shown in FIG. 3C, a large part of photoresist solution R subsequently supplied becomes scattering photoresist solution Rc flowing from the core Ra through the fingers Rb to be cast off to the ambient environment. A large quantity of photoresist solution R must therefore be supplied before the entire surface of wafer W is covered by the photoresist solution R, leading to an excessive consumption of photoresist solution R.

That is, the photoresist film of desired thickness is obtained with a very low efficiency of using photoresist solution R. A coating solution such as photoresist solution is far more expensive than a treating solution such as a developer or a rinse. Thus, a reduction in the quantity of unused, scattering coating solution is an important consideration in achieving low manufacturing costs of semiconductor devices and the like.

SUMMARY OF THE INVENTION

This invention has been made having regard to the state of the art noted above, and its object is to provide a coating solution applying method and apparatus incorporating improved rotational frequency controls to drastically reduce the quantity of coating solution supplied to form a coating film in a desired thickness.

The above object is fulfilled, according to this invention, by a method of applying a coating solution to a surface of a substrate to form a film of desired thickness thereon, comprising the steps of:

(a) spinning the substrate at low speed with a predetermined supplying rotational frequency;

(b) supplying the coating solution to a region centrally of the substrate;

(c) decelerating the substrate to a predetermined standby rotational frequency lower than the supplying rotational frequency before the coating solution spreads over an entire surface of the substrate;

(d) accelerating the substrate to a target rotational frequency higher than the supplying rotational frequency before the coating solution spreads over the entire surface of the substrate; and (e) spinning the substrate at high speed with a predetermined film-forming rotational frequency, thereby coating the surface of the substrate with a film of desired thickness;

wherein supply of the coating solution is continued at least during the step (c) above.

A film of desired thickness is formed on the surface of the substrate by supplying the coating solution to the central region of the substrate spun at low speed with a predetermined supplying rotational frequency, and spinning the substrate at high speed with a predetermined higher film-forming rotational frequency. During these processes, as noted hereinbefore, numerous fingers Rb begin to extend radially from the edge of circular core Ra toward the edge of substrate W (see FIGS. 3A and 3B). When the leading ends of fingers Rb reach the edge of substrate W (FIG. 3C), the photoresist solution flows through the fingers Rb to be scattered away in scattering photoresist solution Rc (FIGS. 3C and 3D). Thus, a large quantity of coating solution is wasted.

According to this invention, the substrate is spun at low speed with a predetermined supplying rotational frequency (step (a)), the coating solution is supplied to a region centrally of the substrate (step (b)), and the substrate is once decelerated to a predetermined standby rotational frequency lower than the supplying rotational frequency before the coating solution spreads over an entire surface of the substrate, i.e. when the core Ra has a circular shape as shown in FIG. 3A, and before the core Ra and fingers Rb cancel each other and cover the entire surface of the substrate W as shown in FIG. 3E (step (c)).

Figure 8:
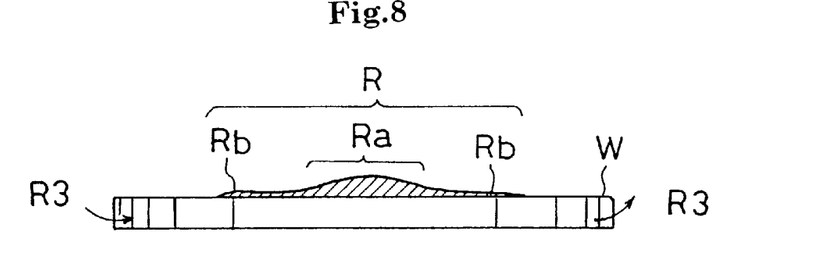
FIG. 8 is a schematic side view showing the behavior of the photoresist solution.
Figure 9:
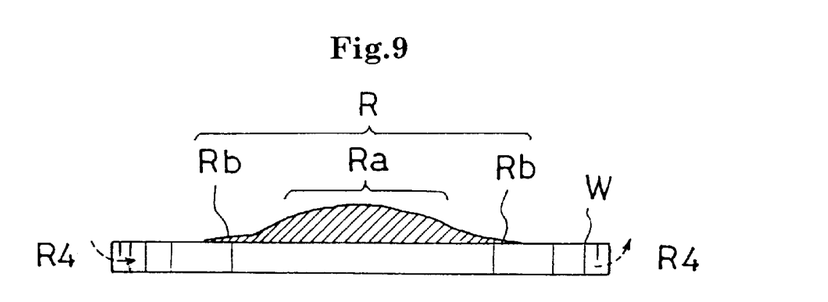
FIG. 9 is another schematic side view showing the behavior of the photoresist solution.
Figure 10:
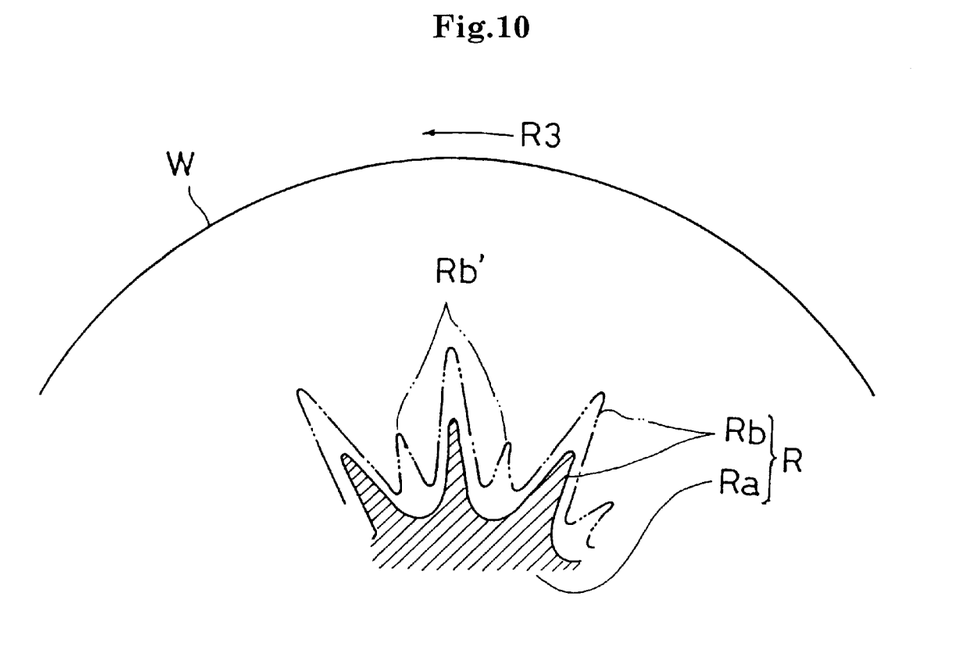
FIG. 10 is a further schematic plan view showing the behavior of the photoresist solution.
Figure 11:
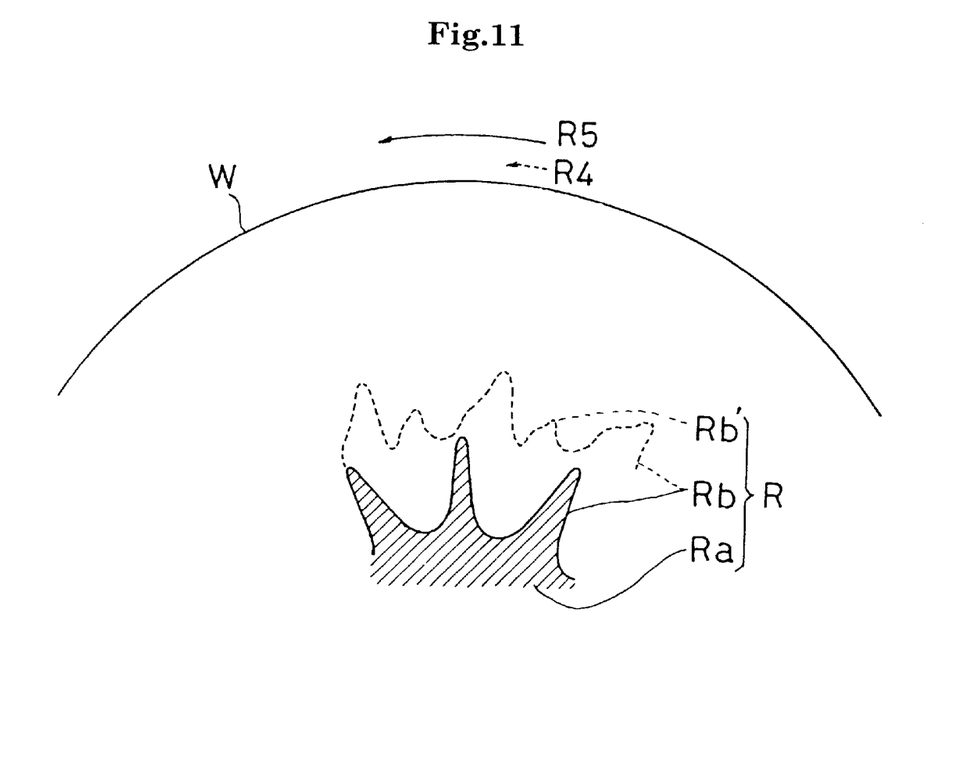
FIG. 11 is a still further schematic plan view showing the behavior of the photoresist solution.

The above condition is met as described hereunder in which the rotational frequency is decreased from the low, supplying rotational frequency to the lower, standby rotational frequency when fingers Rb extend from the core Ra as shown in FIG. 3B. It is to be noted here that the standby rotation frequency includes zero frequency, i.e. stoppage of substrate spinning. With this rotational frequency control, the coating solution exhibits a behavior as schematically shown in FIGS. 8 through 11. FIGS. 8 and 9 are side views schematically showing substrate W and coating solution R. FIGS. 10 and 11 are plan views schematically showing substrate W and coating solution R.

When the rotational frequency is decreased to the standby rotational frequency lower than the supplying rotational frequency, the core Ra and fingers Rb on the substrate W are substantially stopped enlarging or extending. The supply of photoresist solution R is continued in this state at least. Consequently, the core Ra has an increased quantity of photoresist solution R (FIG. 9) compared with the core Ra before the deceleration (FIG. 8). With the core Ra having the increased quantity of coating solution R, i.e. with the core Ra having increased momentum for growth, and before the coating solution covers the entire surface of substrate W, the rotational frequency is increased to the target rotational frequency higher than the standby rotational frequency. Then, the coating solution exhibits a behavior as shown in FIGS. 10 and 11.

If the low, supplying rotational frequency is maintained as in the prior art, the core Ra and fingers Rb, from the state shown in hatches in FIG. 10, grow and extend under centrifugal force toward the edge of substrate W as shown in a two-dot-and-dash line. Besides, new radial rivulets (hereinafter referred to as new fingers Rb') develop from the core R having increased in volume and thus increased momentum for growth. These new fingers Rb' begin to extend from between the numerous fingers Rb toward the edge of substrate W.

According to this invention, the rotational frequency is increased to the target rotational frequency higher than the standby rotational frequency (step (d)), i.e. the substrate spin is accelerated. In the course of acceleration, with the core Ra having increased momentum for growth, the fingers Rb and new fingers Rb' developing as shown in FIG. 10 are subjected to a force of inertia, i.e. a force acting in the direction opposite to the direction of spin. The resultant of centrifugal force and inertia bends the fingers Rb and new fingers Rb' circumferentially, thereby enlarging widths thereof, as shown in FIG. 11. The leading ends of fingers Rb and new fingers Rb' extend under centrifugal force toward the edge of wafer W. The core Ra also increases in diameter.

Consequently, as shown in FIG. 11, the fingers Rb and new fingers Rb' not only extend toward the edge of substrate W but circumferentially increase in width also. Before the fingers Rb reach the edge of substrate W, gaps between the fingers Rb are rapidly narrowed with the aid of new developing fingers Rb'. This drastically reduces time (i.e. coating time) required for the coating solution R to cover the entire surface of substrate W. A short coating time means a short time taken from commencement of supply of coating solution R to stopping of the supply after the coating solution R covers the entire surface of substrate W. In other words, a reduced time is taken from arrival of fingers Rb (and new fingers Rb') at the edge of substrate W to stopping of the supply of photoresist solution R. A correspondingly reduced quantity of photoresist solution R is discarded through the fingers Rb away from the substrate W. As a result, a photoresist film of desired thickness may be formed by a reduced supply of photoresist solution R.

Thus, before the coating solution supplied to the substrate surface spreads over the entire surface of the substrate owing to the supplying rotational frequency, the substrate is once decelerated to the standby rotational frequency while the supply of coating solution is continued. The coating solution thereby increases in concentric form to gain increased momentum for growth. Subsequently, the substrate is accelerated to the target rotational frequency higher than the standby rotational frequency, whereby new flows of the coating solution develop between the radial flows of the coating solution extending from the coating solution in concentric form, with a force of inertia applied to each flow of the coating solution. The gaps between the radially extending flows are thereby narrowed rapidly. This results in a reduction in the quantity of coating solution flowing radially and scattering from the substrate. Thus, a film of desired thickness is formed with a reduced quantity of coating solution. With the reduced consumption of the coating solution, which is more expensive than a developer and a rinsing solution, semiconductor devices and the like may be manufactured at low cost and with improved throughput.

In the method according to this invention, the step (d) of accelerating the substrate to the target rotational frequency, preferably, is initiated after a point of time at which radial flows of the coating solution begin to occur from edges of the coating solution supplied to the surface of the substrate and spread thereon in a circular shape in plan view, and before the radial flows reach edges of the substrate.

In this case, the substrate is accelerated to the target rotational frequency after a point of time at which radial flows of the coating solution begin to occur from edges of the coating solution supplied to the surface of the substrate and spread thereon in a circular shape in plan view (core Ra), i.e. the state shown in FIG. 3A, and before the radial flows (fingers Rb) reach edges of the substrate, i.e. the state shown in FIG. 3C. Thus, a force of inertia is effectively applied to the fingers Rb and new fingers Rb' to increase the widths thereof, thereby to reduce the quantity of coating solution scattering through the fingers Rb (and new fingers Rb') having reached the edges of the substrate. Consequently, a reduced quantity of coating solution is required for forming a film of desired thickness.

Preferably, the supply of the coating solution is stopped between the step (c) and the step (d).

By stopping the supply of the coating solution while the substrate is maintained at the standby rotational frequency, the increase in the coating solution for the core Ra may be completed with enlargement of core Ra and extension of fingers Rb substantially stopped. Thus, with the growth momentum of core Ra maximized, the substrate may be accelerated to the target rotational frequency to enlarge the diameter of core Ra at an increased rate and to develop new fingers Rb' efficiently. As a result, the gaps between the radial flows of the coating solution may be narrowed quickly to shorten the time required for the coating solution to cover the entire surface of the substrate.

Preferably, the target rotational frequency is higher than the film-forming rotational frequency.

To apply a force of inertia to the coating solution extending radially (i.e. fingers Rb and new fingers Rb'), the substrate is accelerated to the target rotational frequency higher than the film-forming rotational frequency for forming a film of desired thickness. Thus, a strong force of inertia may be applied to the coating solution extending radially (fingers Rb and new fingers Rb'), thereby enlarging the circumferential widths of fingers Rb and new fingers Rb' quickly. The entire surface of the substrate may be covered by the coating solution in a reduced time, and a reduced quantity of superfluous coating solution flows radially and scatters from the substrate. Consequently, a film of desired thickness is formed with a reduced quantity of coating solution.

Preferably, the standby rotational frequency is set to zero to stop the substrate.

In this case, the supply of the coating solution is continued while the substrate stands still with the standby rotational frequency maintained at zero. The core Ra is given an increased quantity of photoresist solution while the core Ra and fingers Rb are stopped enlarging or extending. This increases the growth momentum of core Ra efficiently. Thus, when the substrate is accelerated to the target rotational frequency, the new fingers Rb' develop from the core Ra efficiently and the core Ra enlarges in diameter at an increased rate. Since the entire surface of the substrate is covered by the coating solution in a reduced time, a reduced quantity of superfluous coating solution scatters from the substrate. Consequently, a film of desired thickness is formed with a still less quantity of coating solution.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

Figure 4:
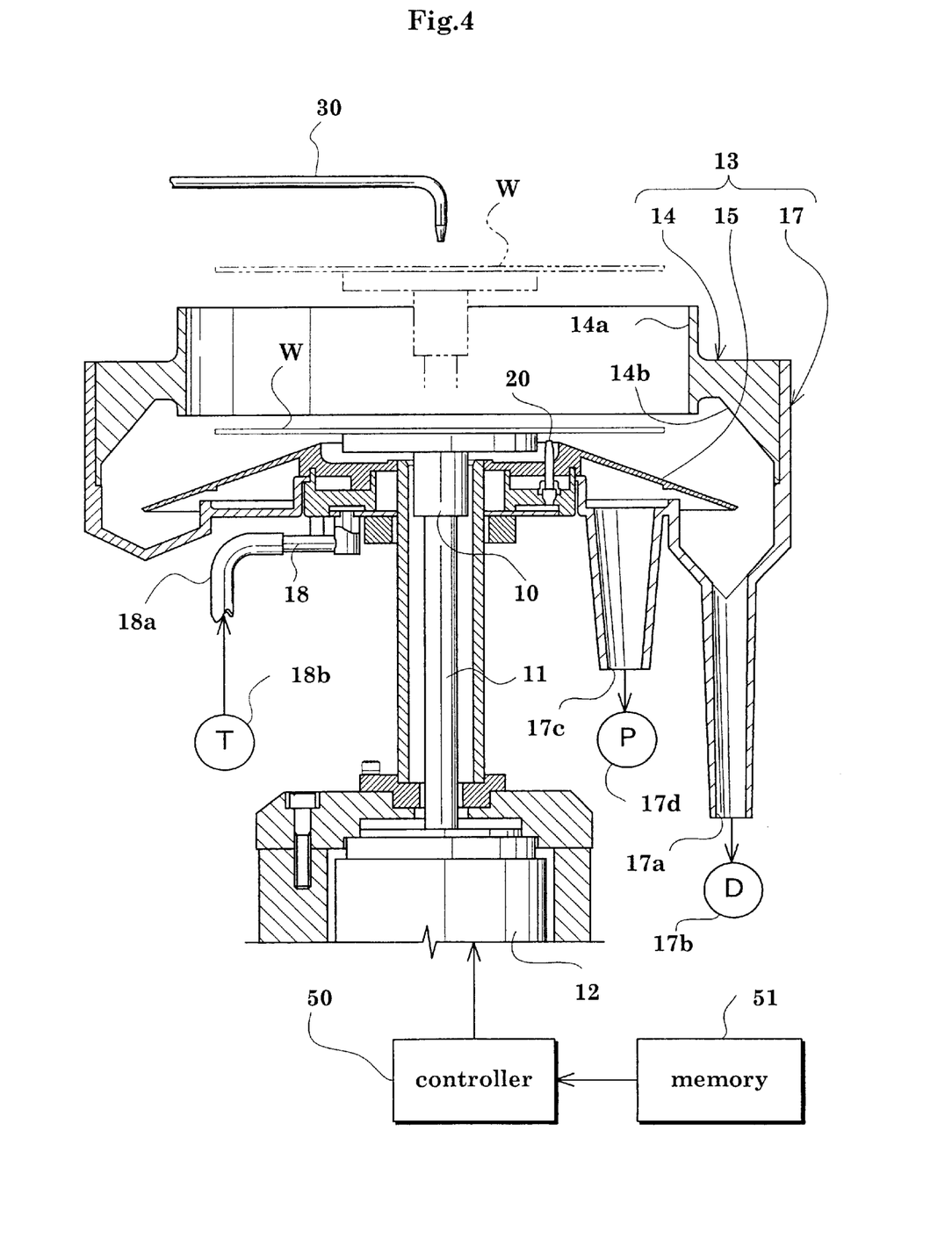
FIG. 4 is a view in vertical section of a substrate spin coating apparatus employing a method according to the present invention.

FIG. 4 is a view in vertical section of a substrate spin coating apparatus for executing a coating solution applying method embodying the present invention. The following description will be made referring to a photoresist solution which is one example of coating solutions.

Reference numeral 10 in FIG. 4 denotes a suction type spin chuck for suction-supporting a substrate or wafer W in a substantially horizontal posture. This spin chuck 10 is attached to a hollow rotary shaft 11 to be rotatable by a spin motor 12. The spin chuck 10, rotary shaft 11 and spin motor 12 constitute the rotary supporting device of this invention.

The spin chuck 10 is surrounded by a scatter preventive cup 13 for preventing a photoresist solution and the like from scattering from the wafer W to the ambient. When a transport device not shown places untreated wafer W on the spin chuck 10 or removes treated wafer W from the spin chuck 10, a lift device not shown vertically moves the rotary shaft 11 and scatter preventive cup 13 relative to each other, whereby the spin chuck 10 is raised above the scatter preventive cup 13 (as shown in two-dot-and-dash lines in FIG. 4).

The scatter preventive cup 13 includes an upper cup 14, a baffle disk 15 and a lower cup 17. The upper cup 14 defines an upper opening 14a, and a slant surface 14b for downwardly guiding sprays of the photoresist solution or the like produced by a spin of wafer W.

The baffle disk 15 straightens and downwardly guides air flows entering through the opening 14a and descending round the edge of wafer W. The sprays of the photoresist solution or the like guided downward by the slant surface 14b of upper cup 13 are entrained by these air flows to enter the lower cup 17.

The lower cup 17 has a liquid outlet 17a formed in a bottom thereof. The liquid outlet 17a is connected to a drain tank 17b for collecting the photoresist solution and the like scattered by a spin of wafer W. Further, a cup vent 17c is formed in the bottom of lower cup 17. The cup vent 17c is connected to an exhaust pump 17d to draw mist of the photoresist solution and the like along with air from inside the scatter preventive cup 13.

Back rinse nozzles 20 are arranged inside the baffle disk 15 for delivering a cleaning solution toward the back side surface of wafer W to remove the part of the photoresist solution flowing round to the back side surface and the mist adhering thereto. The back rinse nozzles 20 receive the cleaning solution from a cleaning solution source 18b through a tube fitting 18 and a supply pipe 18a. Though omitted from the time chart described hereinafter, it is preferable to supply the cleaning solution from the back rinse nozzles 20 to the back side surface of wafer W in order to prevent the photoresist solution and mist thereof from adhering to the back side surface of wafer W and to remove what is already adhering thereto.

A coating solution supply nozzle 30 is disposed above the opening 14a of scatter preventive cup 13 and substantially over the spin center of wafer W for delivering the photoresist solution to the wafer W. This supply nozzle 30 corresponds to the coating solution supplying device of this invention. A supply mechanism, not shown, for supplying the photoresist solution in a predetermined quantity to the nozzle 30, the lift device, not shown, for vertically moving the spin chuck 10 and scatter preventive cup 13 relative to each other, and the spin motor 3 are controlled by a controller 50 corresponding to the control device of this invention. This controller 50 controls the above components based on a program stored in a memory 51 and incorporating time charts described hereinafter.

Figure 5:
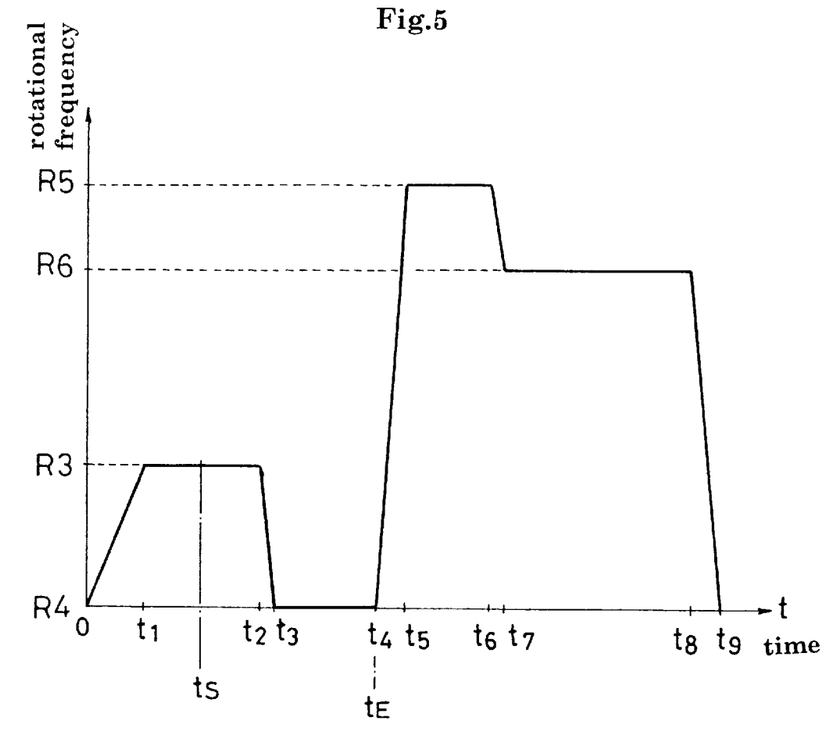
FIG. 5 is a time chart showing a photoresist applying method according to the present invention.

A photoresist applying process will be described next with reference to the time chart of FIG. 5 and schematic views shown in FIGS. 6 through 16.

A program corresponding to this time chart is stored in the memory 51 shown in FIG. 4, and is successively read and executed by the controller 50. It is assumed that the wafer W to be treated is already placed on the suction type spin chuck 10 and that the supply nozzle 30 is standing by adjacent and above the spin center of wafer W.

For expediency of illustration, the schematic views of FIGS. 6 through 16 show wafer W in circles and the photoresist solution in hatched regions. FIGS. 6, 7 and 10 through 13 are plan views, and FIGS. 8 and 9 are side views, each schematically showing the wafer and photoresist solution.

First, the spin motor 12 is started. Specifically, the controller 50 causes the motor 12 to rotate forward to spin the wafer W counterclockwise in plan view. An acceleration rate is set such that a supplying rotational frequency R3 is attained at a point of time ti after a point of time "0" at which the motor 12 is started. The supplying rotational frequency R3 is 1,500 rpm in this example.

At a point of time $t_S$ after the spin of wafer W stabilizes at supplying rotational frequency R3 (i.e. after several seconds), the photoresist solution begins to be supplied through the supply nozzle 30 to the surface of wafer W. At this point of time, as shown in FIG. 6, the photoresist solution is present around the spin center of wafer W in the form of a drop Ra circular in plan view (which is hereinafter referred to as core Ra).

As the photoresist solution continues to be supplied to the region around the spin center of wafer W, the centrifugal force generated by the spin spreads the core Ra concentrically toward the edge of wafer W while allowing the core Ra substantially to retain the circular shape.

The core Ra retains the circular shape for a while (e.g. for several seconds), and thereafter undergoes conspicuous changes in shape as follows.

Figure 6:
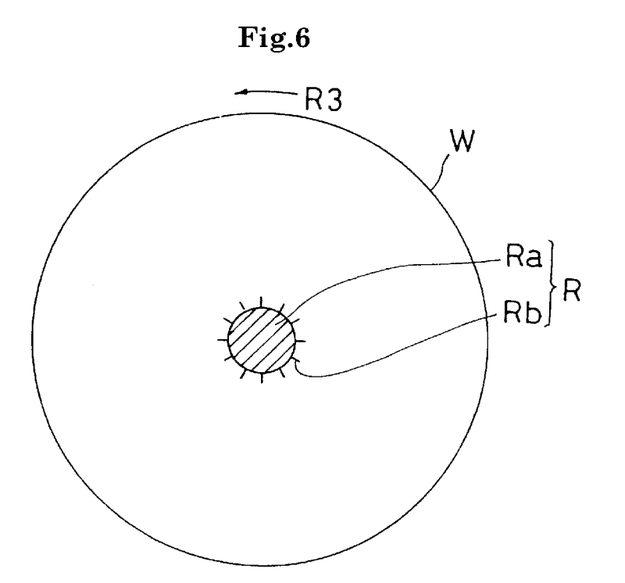
FIG. 6 is a schematic plan view showing a behavior of a photoresist solution.
Figure 7:
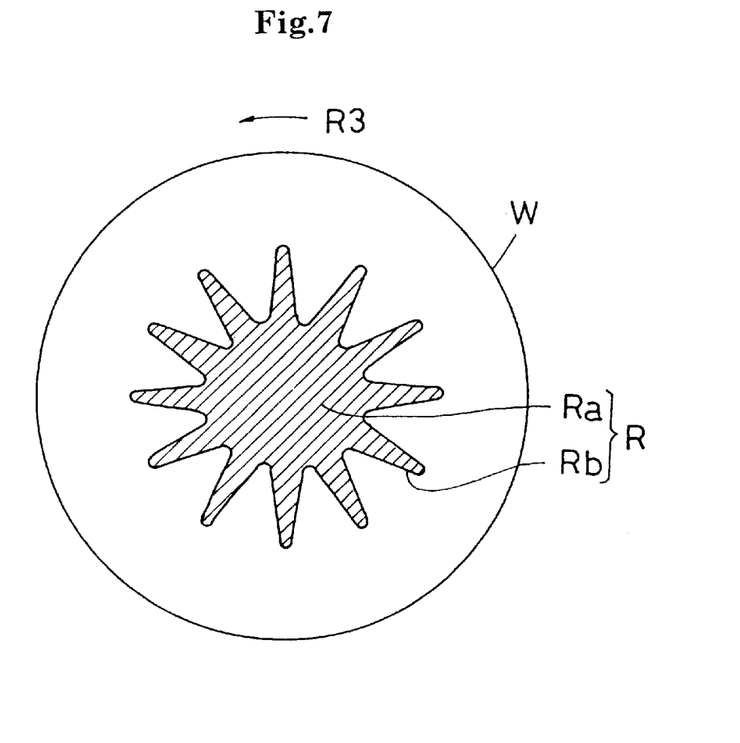
FIG. 7 is another schematic plan view showing the behavior of the photoresist solution.

As shown in FIGS. 6 and 7, the photoresist solution begins to flow in a plurality of rivulets Rb (hereinafter referred to as fingers Rb) extending radially from the edge of circular core Ra toward the edge of wafer W. These numerous fingers Rb, by the centrifugal force, continue to grow toward the edge of wafer W with an increase in the diameter of the core Ra. Since the fingers Rb are subjected to a greater centrifugal force than the core Ra, the fingers Rb grow toward the edge of wafer W faster than the enlargement of the core Ra, from the state shown in FIG. 6 to the state shown in FIG. 7. FIG. 8 is a side view schematically showing the state of FIG. 7.

Then, before the entire surface of wafer W is covered by photoresist solution R supplied, the rotational frequency of wafer W is decreased from the supplying rotational frequency R3 (1,500 rpm) to a lower, standby rotational frequency R4. The standby rotational frequency R4 is 0 rpm in this example, at which the wafer W stands still. Specifically, after maintaining the supplying rotational frequency R3 until a point of time $t_2$, the spin motor 12 is controlled to reduce the rotational frequency to 0 rpm at a point of time $t_3$.

By decreasing the rotational frequency from supplying rotational frequency R3 to standby rotational frequency R4 to stop the wafer W, growth of the fingers Rb extending radially from the edge of core Ra toward the edge of wafer W is temporarily stopped. The supply of photoresist solution R is continued in this state. Consequently, as shown in FIG. 9, the quantity of photoresist solution R is increased only in respect of the core Ra. With the increased volume, the core Ra itself gains increased momentum for growth.

When the wafer W is kept spinning at the supplying rotational frequency R3 as in the prior art, with the core Ra given increased momentum for growth by the increased quantity of photoresist solution R, the photoresist solution R exhibits a behavior as shown in FIG. 10. From the state shown in hatches in FIG. 10, the core Ra and fingers Rb grow and extend under centrifugal force toward the edge of wafer W as shown in a two-dot-and-dash line. Besides, new radial rivulets (hereinafter referred to as new fingers Rb') develop from the core R having increased in volume and thus increased momentum for growth. These new fingers Rb' begin to extend from between the numerous fingers Rb toward the edge of wafer W.

Before the photoresist solution covers the entire surface of wafer W, in particular before the fingers Rb reach the edge of wafer W, the rotational frequency of wafer W is increased to a target rotational frequency R5 higher than the standby rotational frequency R4 (0 rpm) noted hereinbefore. In a specific spin control, the controller 50 maintains the rotational frequency of spin motor 12 at the standby rotational frequency R4 between points of time $t_3$ and $t_4$. and then stops the supply of photoresist solution R through the supply nozzle 30 at point of time $t_4$. Within a short period from point of time $t_4$ to point of time $t_5$ following stopping of the supply of photoresist solution R, the rotational frequency of spin motor 12 is rapidly increased from standby rotational frequency R4 to target rotational frequency R5. The target rotational frequency R5 is 4,000 rpm for example. By stopping the supply of photoresist solution R at point of time $t_4$ when the rotational frequency begins to be increased from standby rotational frequency R4 to target rotational frequency R5, the photoresist solution R with the core Ra having maximized momentum for growth, undergoes the action set out hereunder to develop the new fingers Rb' efficiently and enlarge the diameter of core Rb at an increased rate.

Figure 12:
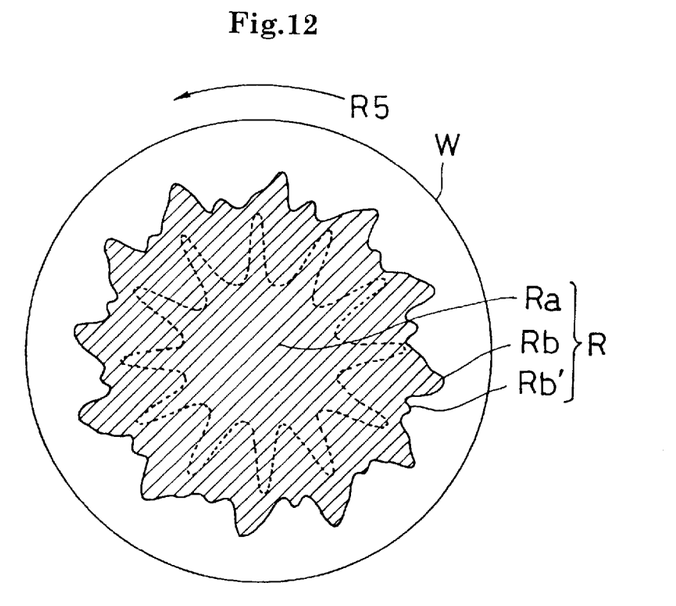
FIG. 12 is a still further schematic plan view showing the behavior of the photoresist solution.

In the course of rapid acceleration, with the core Ra having increased momentum for growth, the fingers Rb and new fingers Rb' developing as shown in FIG. 10 are subjected to a force of inertia, i.e. a force acting in the direction opposite to the direction of spin (indicated by an arrow in FIG. 11). The resultant of centrifugal force and inertia bends the fingers Rb and new fingers Rb' circumferentially, thereby enlarging widths thereof, as shown in FIGS. 11 and 12. The leading ends of the fingers Rb and new fingers Rb' extend under centrifugal force toward the edge of wafer W. In addition, the diameter of core Ra increases.

Figure 13:
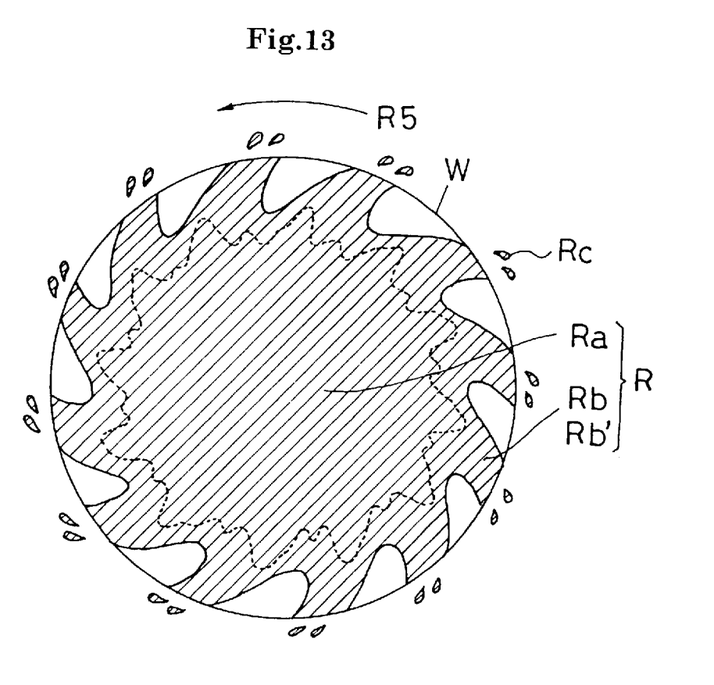
FIG. 13 is a still further schematic plan view showing the behavior of the photoresist solution.
Figure 14:
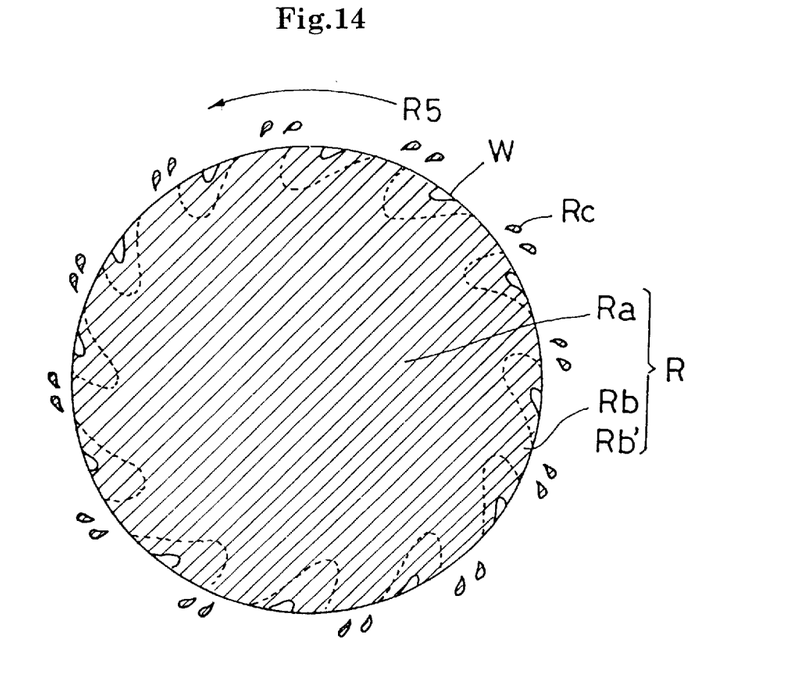
FIG. 14 is a still further schematic plan view showing the behavior of the photoresist solution.
Figure 15:
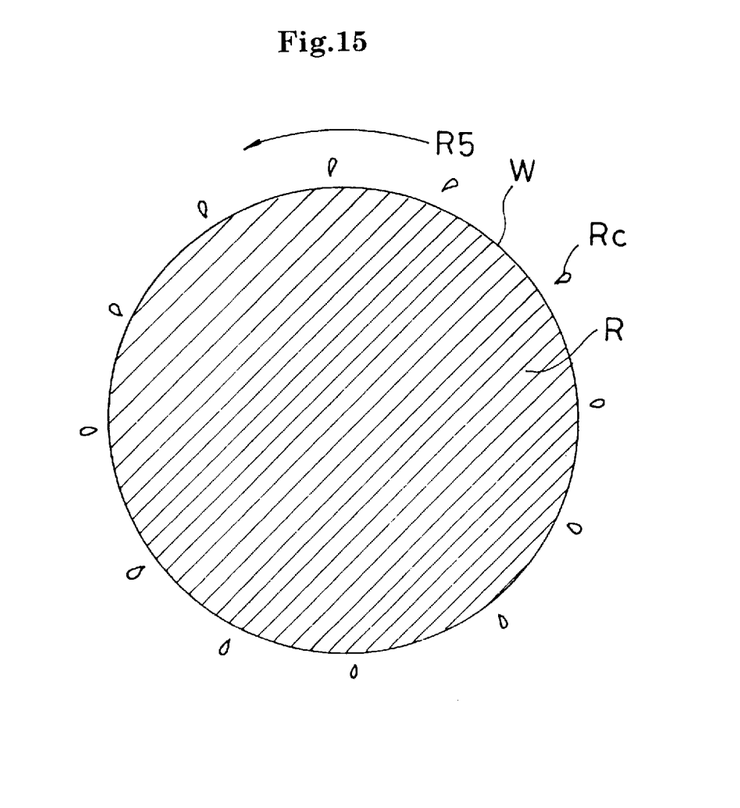
FIG. 15 is a still further schematic plan view showing the behavior of the photoresist solution.

When the leading ends of numerous fingers Rb and numerous new fingers Rb' reach the edge of wafer W as shown in FIG. 13, the photoresist solution R scatters from these leading ends outwardly of wafer W (hereinafter called scattering photoresist solution Rc). However, since the fingers Rb and new fingers Rb' are bent circumferentially owing to the acceleration, the core Ra, new fingers Rb' and fingers Rb grow and spread in unison toward the edge of wafer W. Thus, the time taken for the photoresist solution to cover the entire surface of wafer W is much shorter than in the prior art (FIGS. 13 through 15). With the above action applied to the photoresist solution R, the spin at the target rotational frequency R5 is maintained until point of time $t_6$. Since the rotational frequency of wafer W is increased to the target rotational frequency R5 after the temporary deceleration to the standby rotational frequency R4 as described above, a great difference occurs between these rotational frequencies to generate a strong force of inertia. Consequently, the circumferential widths of fingers Rb and new finger Rb' may be enlarged rapidly.

An excessive acceleration would cause an inconvenience that the fingers Rb and new fingers Rb' scatter away or, even if once bent circumferentially, extend straight toward the edge of wafer W under centrifugal force. Thus, acceleration should be in the range of 7,500 rpm/sec. to 50,000 rpm/sec.

Figure 16:
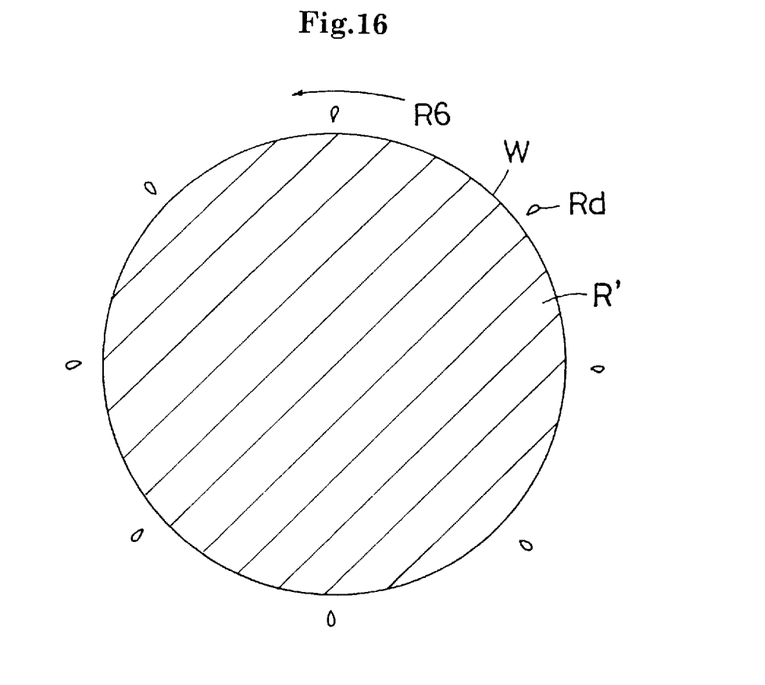
FIG. 16 is a still further schematic plan view showing the behavior of the photoresist solution.

The target rotational frequency R5 is maintained until point of time $t_6$, and then the spin is decelerated to reach a film-forming rotational frequency R6 (e.g. 3,000 rpm) by point of time $t_7$, which is a rotational frequency for obtaining a desired film thickness. This rotational frequency is maintained till point of time $t_8$. As a result, as shown in FIG. 16, a small superfluous part of photoresist solution R covering the entire surface of wafer W is dispelled (superfluous photoresist solution Rd), thereby forming a photoresist film R' in a desired thickness on the surface of wafer W. The controller 50 controls the spin motor 12 to stop the spinning wafer W at point of time $t_9$. This completes treatment of one wafer W.

The process from point of time "0" to point of time $t_2$ corresponds to step (a) in this invention. The process from point of time $t_S$ to point of time $t_E$ corresponds to step (b). The process from point of time $t_2$ to point of time $t_4$ corresponds to step (c). The process from point of time $t_4$ to point of time $t_5$ corresponds to step (d). The process from point of time $t_7$ to point of time $t_8$ corresponds to step (e).

As described above, the photoresist solution R is supplied the wafer W spinning at low speed, and the spin is temporarily decelerated to the standby rotational frequency before the surface of wafer W is covered by the photoresist solution R. The photoresist solution R is given increased spreading momentum while checking enlargement in the diameter of core Ra and extension of fingers Rb. Then, the rotational frequency is rapidly increased to the target rotational frequency R5. This results in a development of new fingers Rb' contributing to a reduced coating time required for the entire surface of wafer W to be covered by the photoresist solution R.

Thus, a reduced time is taken from arrival of fingers Rb (and new fingers Rb') at the edge of wafer W to stopping of the supply of photoresist solution R. A reduced quantity of photoresist solution R is discarded through the fingers Rb away from the wafer W. As a result, a photoresist film of desired thickness may be formed by a drastically reduced supply of photoresist solution.

A period from point of time $t_3$ to point of time $t_4$ for maintaining the standby rotational frequency R4 may be determined based on the size of wafer W, flow velocity per unit time of photoresist solution R supplied through the supply nozzle 30, quantity of photoresist solution needed to obtain the desired film thickness, and so on.

A rotational frequency control different from the foregoing control will be described next with reference the time chart of FIG. 17.

First, the photoresist solution R begins to be supplied at point of time $t_S$ while the wafer W is spun at a supplying rotational frequency R7 (e.g. 1,500 rpm). The spin is decelerated at point of time $t_2$ to reach a standby rotational frequency R8 at point of time $t_3$. This standby rotational frequency R8 is not zero but lower (e.g. 1,000 rpm) than the supplying rotational frequency R7. Enlargement of core Ra and extension of fingers Rb may be substantially stopped by decelerating the wafer W to the lower rotational frequency than the supplying rotational frequency R7 instead of stopping the wafer W. By continuing the supply of photoresist solution R in the meantime, only the volume of core Ra may be increased to increase its momentum for growth.

The spin is rapidly accelerated at point of time $t_4$ to attain a target rotational frequency R9 (=film-forming rotational frequency R10, e.g. 3,000 rpm) at point of time $t_5$. The supply of photoresist solution R is continued until point of time $t_E$.

The target rotational frequency R9 (=film-forming rotational frequency R9) is maintained until point of time $t_6$, and the spin is stopped at point of time $t_7$. The same effect is produced as by the coating process based on the preceding time chart (FIG. 5), by reducing the standby rotational frequency R8 below the supplying rotational frequency R7, though not zero rpm, to increase only the growth momentum of core Ra.

Figure 17:
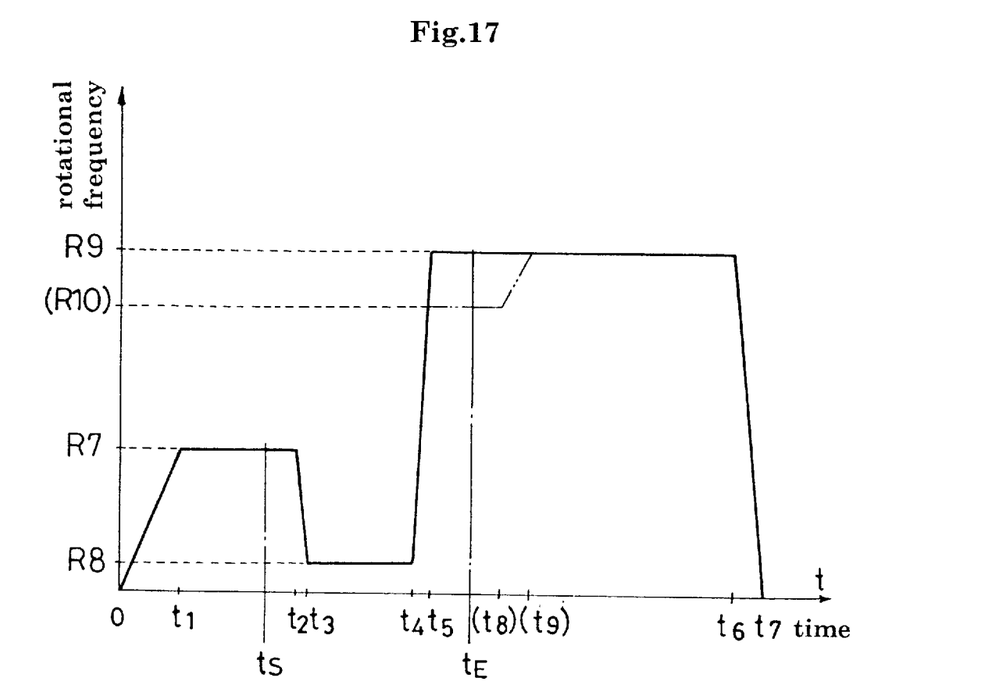
FIG. 17 is a time chart showing a modified photoresist applying method.

As shown in a two-dot-and-dash line in FIG. 17, a target rotational frequency (R10) may be set higher than the standby rotational frequency R8 and lower than the film-forming rotational frequency R9. This also produces the same effect as above.

The above rotational frequencies, point of time $t_S$ and point of time $t_E$ for starting and stopping the supply of photoresist solution R, deceleration starting time $t_2$, decelerating period $t_3$-$t_4$ and accelerating period $t_4$-$t_5$ are given by way of example only. These time settings may be selected according to wafer sizes, surface conditions of the wafers, viscosity of the coating solution, a desired film thickness and so on.

The standby rotational frequency is not limited to one if only lower than the supplying rotational frequency R3 or R7 to substantially stop enlargement of core Ra and extension of fingers Rb. For example, a first standby rotational frequency may be set to 0 rpm, and a second standby rotational frequency to 1,000 rpm. Then, the first standby rotational frequency (stoppage) maximizes the growth momentum of core Ra, while the second standby rotational frequency lightens the load of spin motor 12 in the rapid acceleration from the stoppage to the target rotational frequency.

The foregoing embodiment and modification have been described in relation to the photoresist solution as one example of coating solutions. Needless to say, the coating solution may be SOG solution or polyimide resin.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of applying a coating solution to a surface of a substrate to form a film of desired thickness thereon, comprising the steps of:
   (a) spinning said substrate at a supplying rotational frequency;
   (b) supplying said coating solution to a region centrally of said substrate while said substrate is spinning at said supplying rotational frequency;
   (c) decelerating said substrate to a standby rotational frequency lower than said supplying rotational frequency before said coating solution spreads over an entire surface of said substrate;
   (d) accelerating said substrate to a target rotational frequency higher than said standby rotational frequency before said coating solution spreads over said entire surface of said substrate; and
   (e) spinning said substrate at a film-forming rotational frequency, thereby coating said surface of said substrate with a film of desired thickness;
   wherein supply of said coating solution is continued at least during the step (c) above.

2. A method as defined in claim 1, wherein the step (d) of accelerating said substrate to said target rotational frequency is initiated after a point of time at which radial flows of said coating solution begin to occur from edges of said coating solution supplied to said surface of said substrate and spread thereon in a circular shape in plan view, and before said radial flows reach edges of said substrate.

3. A method as defined in claim 2, wherein the supply of said coating solution is stopped between the step (c) and the step (d).

4. A method as defined in claim 2, wherein said target rotational frequency is higher than said film-forming rotational frequency.

5. A method as defined in claim 2, wherein said standby rotational frequency is zero.

6. A method as defined in claim 2, wherein said target rotational frequency equals said film-forming rotational frequency.

7. A method as defined in claim 2, wherein said target rotational frequency is higher than said standby rotational frequency and lower than said film-forming rotational frequency.

8. A method as defined in claim 1, wherein the supply of said coating solution is stopped between the step (c) and the step (d).

9. A method as defined in claim 8, wherein said target rotational frequency is higher than said film-forming rotational frequency.

10. A method as defined in claim 9, wherein said standby rotational frequency is zero.

11. A method as defined in claim 8, wherein said standby rotational frequency is zero.

12. A method as defined in claim 8, wherein said target rotational frequency equals said film-forming rotational frequency.

13. A method as defined in claim 8, wherein said target rotational frequency is higher than said standby rotational frequency and lower than said film-forming rotational frequency.

14. A method as defined in claim 1, wherein said target rotational frequency is higher than said film-forming rotational frequency.

15. A method as defined in claim 1, wherein said standby rotational frequency is zero.

16. A method as defined in claim 15, wherein said target rotational frequency equals said film-forming rotational frequency.

17. A method as defined in claim 1, wherein said target rotational frequency equals said film-forming rotational frequency.

18. A method as defined in claim 1, wherein said target rotational frequency is higher than said standby rotational frequency and lower than said film-forming rotational frequency.

* * * * *